US006947140B2

(12) United States Patent
Yabu

(10) Patent No.: US 6,947,140 B2
(45) Date of Patent: Sep. 20, 2005

(54) BIREFRINGENCE MEASUREMENT APPARATUS AND METHOD

(75) Inventor: Shuichi Yabu, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 73 days.

(21) Appl. No.: 10/391,912

(22) Filed: Mar. 19, 2003

(65) Prior Publication Data

US 2003/0184749 A1 Oct. 2, 2003

(30) Foreign Application Priority Data

Mar. 29, 2002 (JP) ....................................... 2002-095782

(51) Int. Cl.[7] .................................................. G01J 4/00
(52) U.S. Cl. ....................................................... 356/365
(58) Field of Search .......................................... 356/365

(56) References Cited

U.S. PATENT DOCUMENTS 5,400,131 A * 3/1995 Stockley et al. ............ 356/365
5,406,371 A * 4/1995 Sakai et al. ................. 356/367
5,825,492 A * 10/1998 Mason ........................ 356/491
5,917,598 A * 6/1999 Mason ........................ 356/491
6,023,332 A * 2/2000 Bergstrom et al. .......... 356/365
6,157,448 A * 12/2000 Kowa et al. ................ 356/365
6,693,710 B1 * 2/2004 Hoyt .......................... 356/365
6,769,273 B1 * 8/2004 Nakagawa et al. ........... 65/378
2001/0008540 A1 * 7/2001 Oba et al. ................... 372/101

FOREIGN PATENT DOCUMENTS

JP 8-254495 10/1996

* cited by examiner

*Primary Examiner*—Michael P. Stafira
*Assistant Examiner*—Juan D. Valentin, II
(74) *Attorney, Agent, or Firm*—Morgan & Finnegan, LLP

(57) ABSTRACT

A birefringence measurement apparatus includes a measurement part for measuring a birefringence azimuth and a birefringence amount of an object to first and second light having different wavelengths from each other, and a determination part for calculating at least one of a birefringence azimuth and a birefringence amount to third light different in wavelength from the first and second light based on the birefringence azimuth and birefringence amount of the object to the first and second light.

10 Claims, 2 Drawing Sheets

BIREFRINGENCE MEASUREMENT APPARATUS AND METHOD

BACKGROUND OF THE INVENTION

The present invention relates generally to birefringence measurement apparatuses, and more particularly to a birefringence measurement apparatus that measures a birefringence of calcium fluoride ($CaF_2$) to $F_2$ laser, usable for an exposure apparatus that uses $F_2$ laser.

A hyperfine pattern formation has increasingly been demanded with a recent progress of highly integrated semiconductor circuits. A demagnification projection exposure apparatus has frequently been used as a lithography apparatus to transfer a fine pattern. The higher integration requires increased resolution of a projection lens, which requires a shorter wavelength of exposure light and a larger numerical aperture of a projection lens.

The shortened wavelength of exposure light has advanced from a g-line (with a wavelength of 436 nm) to an ArF excimer laser (with 193 nm) through an i-line (with 365 nm) and a KrF excimer laser (with 248 nm), and use of an $F_2$ excimer laser (with 157 nm) has been considered promising. A conventional optical element is applicable to an optical system for the wavelength range to the i-line, but conventional optical glass cannot be used for the wavelength range including the KrF and ArF excimer lasers and the $F_2$ laser due to its law transmittance. Therefore, an optical system in an excimer laser exposure apparatus has commonly used an optical element made of quartz glass or calcium fluoride having larger transmittance to a shortened wavelength of light, and it has been considered that an $F_2$ laser exposure apparatus necessarily uses an optical element made of calcium fluoride.

While each lens in a projection lens should be polished with ultimate surface precision, the lens when made of polycrystal causes the polishing speed to vary according to crystal orientations, and a difficulty in maintaining its surface precision. In addition, the polycrystal easily segregates impurities at a crystal interface, deteriorating uniformity of refractive index and emitting fluorescence responsive to a laser irradiation. For these reasons, a large aperture and highly homogeneous single crystal calcium fluoride have been demanded.

Calcium fluoride single crystal has been manufactured mainly by the crucible descent method or Bridgman method. This method fills highly purified materials of chemical compounds in a crucible, melts in a growth device, and gradually descends the crucible, thereby crystallizing the materials from the bottom of the crucible. The heat history in this growth process remains as a stress in calcium fluoride crystal. Calcium fluoride exhibits birefringence to the stress. The residual stress deteriorates the optical characteristics, and thus the heat process applies so as to remove the stress after the crystal growth. A birefringence measurement follows the heat process, and feeds the product to the next lens process step after confirming that the birefringence amount is less than the desired value.

The stress-dependent birefringence is a function of the stress and a piezo-optical coefficient. Since the piezo-optical coefficient is different according to wavelengths of light, the birefringence amount differs according to used wavelengths even under the same stress condition. Therefore, the birefringence amount of the calcium fluoride used for the $F_2$ laser exposure apparatus should be measured with the $F_2$ laser (with a wavelength of 157 nm).

However, the $F_2$ laser is absorbed by oxygen and cannot transmit in the air, requiring a special environment without oxygen, and thus disadvantageously causing a large measurement apparatus, the increased cost, and the deteriorated operability.

BRIEF SUMMARY OF THE INVENTION

Accordingly, it is an exemplified object of the present invention to provide a birefringence measurement apparatus and method which may measure a birefringence amount of an object, such as calcium fluoride, to the $F_2$ laser without using the $F_2$ laser.

A birefringence measurement apparatus of one aspect of the present invention includes a measurement part for measuring a birefringence azimuth (or principal axis direction angle) and a birefringence amount of an object to first and second light having different wavelengths from each other, and a determination part for calculating at least one of a birefringence azimuth and a birefringence amount to third light different in wavelength from the first and second light based on the birefringence azimuth and birefringence amount of the object to the first and second light.

The first and second light may have wavelengths equal to or larger than 180 nm, and the third light may have a wavelength equal to or less than the wavelengths of the first and second light. The object may be made of calcium fluoride. The third light may be an $F_2$ laser beam.

The determination part calculates a birefringence azimuth $\Phi_3$ and birefringence amount $\Delta N_3$ to the third light using the following equations where $N_1$, $N_2$ and $N_3$, and $[(\pi_{ij})_1]$ $[(\pi_{ij})_2]$ and $[(\pi_{ij})_3]$ are refractive indexes and piezo-optical tensors respectively of the object to the first, second and third light, $\Phi_1$ and $\Phi_2$, and $\Delta N_1$ and $\Delta N_2$ are birefringence azimuths and birefringence amounts of the object to the first and second light measured by said measurement part:

EQUATION 1

$$p_i = (\pi_{11})_i - (\pi_{12})_i \qquad q_i = (\pi_{44})_i \qquad (i = 1, 2, 3)$$

$$r_1 = p_2 q_3 - p_3 q_2 \qquad r_2 = p_3 q_1 - p_1 q_3 \qquad r_3 = p_1 q_2 - p_2 q_1$$

$$K_1 = -\left(\frac{N_3}{N_1}\right)^3 \frac{r_1}{r_3} \qquad K_2 = -\left(\frac{N_3}{N_2}\right)^3 \frac{r_2}{r_3}$$

$$A_1 = K_1 \Delta N_1 \qquad A_2 = K_2 \Delta N_2$$

$$\Delta N_3 = \sqrt{A_1^2 + A_2^2 + 2A_1A_2\cos(2\phi_1 - 2\phi_2)}$$

$$2\phi_3 = \tan^{-1}\left(\frac{A_1\sin 2\phi_1 + A_2\sin 2\phi_2}{A_1\cos 2\phi_1 + A_2\cos 2\phi_2}\right)$$

$0<2\Phi_3<\pi$ when the numerator is positive, whereas $-\pi<2\Phi_3<0$ when the numerator is negative.

A birefringence measurement method of another aspect of the present invention includes the steps of measuring a birefringence azimuth and a birefringence amount of an object to first light, measuring a birefringence azimuth and a birefringence amount of an object to second light different in wavelength from the first light, and determining at least one of a birefringence azimuth and a birefringence amount to third light different in wavelength from the first and second light based on the birefringence azimuth and birefringence amount of the object to the first and second light.

A method for manufacturing an optical element includes the step of measuring a birefringence amount using the above birefringence measurement apparatus, and a projection exposure apparatus including a projection optical system that includes an optical element manufactured by the above method, also constitute other aspects of the present invention.

Other objects and further features of the present invention will become readily apparent from the following description of the embodiments with reference to accompanying drawings.

DETAILED DESCRIPTION OF THE PREFERRED EMBODIMENTS

Figure 1:
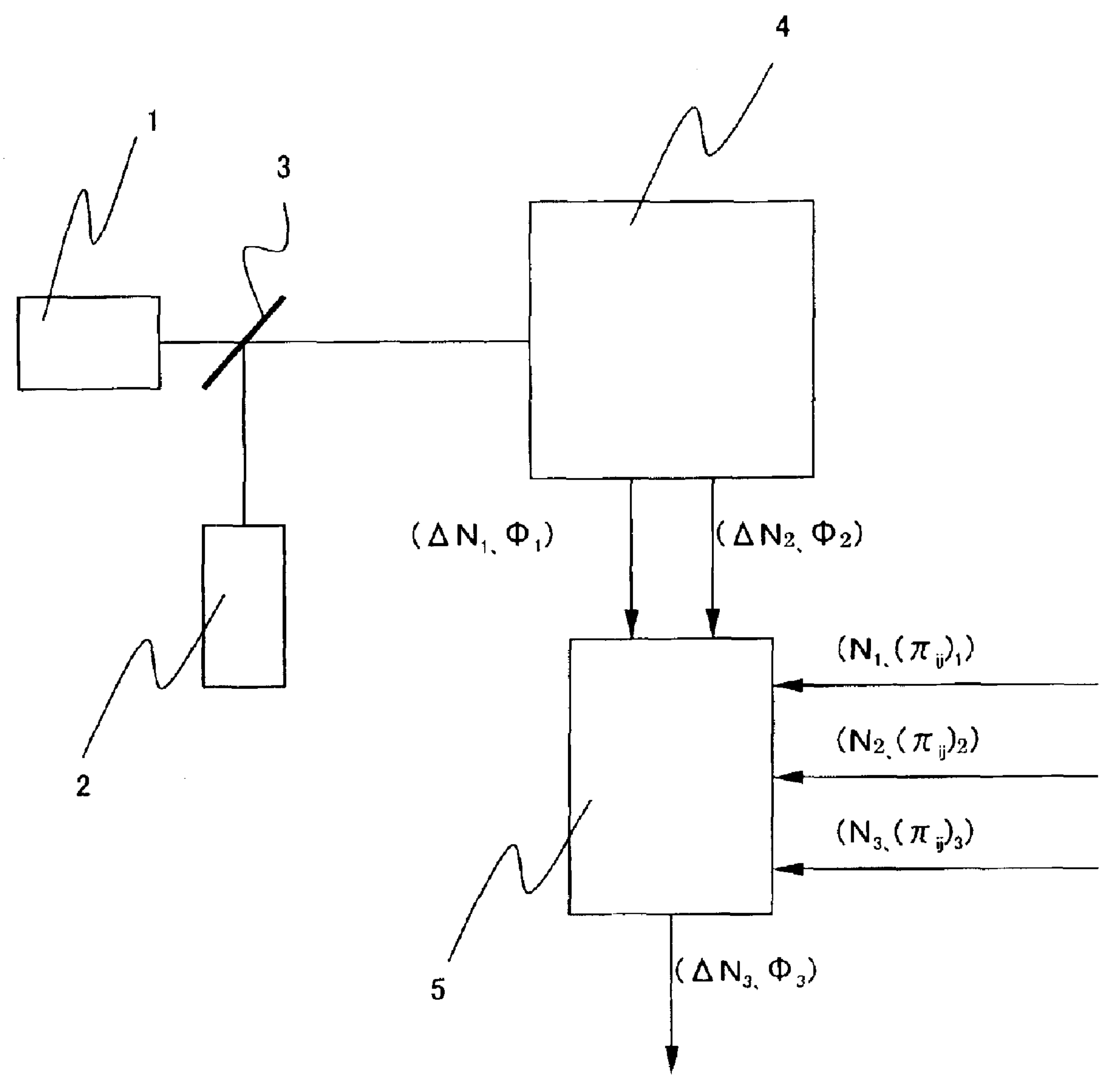
FIG. 1 is a schematic block diagram of a birefringence measurement apparatus of one embodiment according to the present invention.

The birefringence measurement apparatus of the instant embodiment includes two light sources, i.e., first and second light sources, which have wavelengths larger than that of $F_2$ laser and are usable in the air or in an environment purged with a little oxygen, a birefringence measurement means for measuring a birefringence azimuth and a birefringence amount of an object, such as calcium fluoride, to the light from these two light sources and a determination means for calculating at least one of a birefringence azimuth and a birefringence amount to $F_2$ laser based on the birefringence azimuth (or an orientation of a birefringence principal axis) and birefringence amount of the object the first and second light.

In this structure, the birefringence measurement means first measures a birefringence azimuth $\Phi_1$ and a birefringence amount $\Delta N_1$ using the first light source, and then measures a birefringence azimuth $\Phi_2$ and a birefringence amount $\Delta N_2$ using the second light source. Then, the determination means uses previous information ($\Phi_1$, $\Phi_2$, $\Delta N_1$, $\Delta N_2$) to calculate a birefringence azimuth $\Phi_3$ and birefringence amount $\Delta N_3$ to the $F_2$ laser. A description will be given of the principal below.

A birefringence characteristic may be described with a refractive index ellipsoid. Suppose that the light that passes the origin O in the refractive index ellipsoid. The light generates a pair of linearly polarized light as an allowed vibration that vibrates in major-axis and minor-axis directions in an ellipse (E), and proceeds without changing a plane of vibration in an object. The ellipse (E) is defined as an intersection line between a plane orthogonal to a light proceeding direction including the origin O, and the refractive index ellipsoid. The major-axis and minor-axis lengths provide a refractive index of the allowed vibration.

According to a theory of the crystal optics, the refractive index ellipsoid is a sphere in equi-axed crystal, such as calcium fluoride, under no stress, but turns to an ellipsoid when subject to the stress. A distance OP from the origin O to a point P on a surface of the refractive index ellipsoid is expressed in the following equation where N is a refractive index of calcium fluoride to the light with a certain wavelength, $[\pi_{ij}]$ is a piezo-optical tensor, ($\sigma_{11}$, $\sigma_{22}$, $\sigma_{33}$, $\sigma_{23}$, $\sigma_{31}$, $\sigma_{12}$) is a stress, ($x_1$, $x_2$, $x_3$) is a directional vector of the vector OP (while $x_1^2+x_2^2+x_3^2=1$):

EQUATION 2

$$OP = N - \frac{N^3}{2}\pi_{12}(\sigma_{11}+\sigma_{22}+\sigma_{33}) - \frac{N^3}{2}(\pi_{11}-\pi_{12})(\sigma_{11}x_1^2+\sigma_{22}x_2^2+\sigma_{33}x_3^2) -$$

-continued $$\frac{N^3}{2}\pi_{44}(\sigma_{23}x_2x_3+\sigma_{31}x_3x_1+\sigma_{12}x_1x_2)$$

A first term in Equation 2 denotes a refractive index under no stress, a second term denotes a refractive index change independent of a direction (or homogeneity), and third and fourth terms denote a refractive index change depending upon a direction (or birefringence).

According to the study result by the instant inventor, a phase difference that occurs after the orthogonal pair of linearly polarized light passes a sample may be approximated to a phase difference that occurs when the linearly polarized light passes a sample with the same refractive index as a radius in a direction of a plane of vibration ($S_1$, $S_2$) of the ellipse (E) the while maintaining at the time of incidence. Therefore, an approximate calculation is established by interpreting that Equation 2 indicates a refractive index for linearly polarized light when a direction of the electric field vector is ($x_1$, $x_2$, $x_3$).

Equation 2 may be integrated in the light direction and averaged for a variable stress changes in the light proceeding direction. For the fixed direction ($x_1$, $x_2$, $x_3$) of the electric field vector and the integral of Equation 2, the stress component is integrated since components other than $\sigma_{ij}$ is a constant. Therefore, for a variable stress in the light proceeding direction, it is considered that the stress component $\sigma_{ij}$ in Equation 2 is a value that has been integrated and averaged in the light' direction.

A phase difference (or refractive index difference) is calculated with respect to an orthogonal pair of linearly polarized light around a fixed optical axis. The following equations may be established using a rotational angle $\alpha$ around the optical axis as a parameter where ($x_1$, $x_2$, $x_3$) and ($y_1$, $y_2$, $y_3$) are directions of the electric field vector of the orthogonal pair of linearly polarized light:

$$x_i=a_i\cos\alpha+b_i\sin\alpha$$

$$y_i=a_i\sin\alpha-b_i\cos\alpha \quad \text{EQUATION 3}$$

$$x_ix_j=a_ia_j\cos^2\alpha+b_ib_j\sin^2\alpha+(a_ib_j+b_ia_j)\text{cso}\alpha\sin\alpha$$

$$y_iy_j=a_ia_j\sin^2\alpha+b_ib_j\cos^2\alpha-(a_ib_j+b_ia_j)\text{cso}\alpha\sin\alpha \quad \text{EQUATION 4}$$

$$x_ix_j-y_iy_j=(a_ia_j-b_ib_j)\cos 2\alpha+(a_ib_j+b_ia_j)\sin 2\alpha \quad \text{EQUATION 5}$$

Equation 5 means that ($x_ix_j-y_iy_j$) may be expressed as a linear combination of cos 2α and sin 2α. The refractive index difference ΔN(α) may be expressed by substituting Equation 3 for Equation 2 as follows:

EQUATION 6

$$\Delta N(\alpha) = -\frac{N^3}{2}(\pi_{11}-\pi_{12})(u_1\cos 2\alpha+v_1\sin 2\alpha) - \frac{N^3}{2}\pi_{44}(u_2\cos 2\alpha+v_2\sin 2\alpha)$$

Equation 6 is in a form of a linear combination of cos 2α and sin 2α, and thus may be turned as follows:

$$\Delta N(\alpha)=M\cos(2\alpha+\theta) \quad \text{EQUATION 7}$$

Equation 7 may be expressed where ΔNo is a birefringence amount and Φ is a birefringence azimuth as follows:

$$\Delta N(\alpha)=\Delta No\cos(2\alpha-2\Phi) \quad \text{EQUATION 8}$$

Here, suppose the following EQUATION 9:

$$T_1(\alpha)=u_1\cos 2\alpha+v_1\sin 2\alpha$$

$$T_2(\alpha)=u_2\cos 2\alpha+v_2\sin 2\alpha \qquad \text{EQUATION 9}$$

Then, Equation 6 may be expressed as follows:

$$\Delta N(\alpha)=-\frac{N^3}{2}(\pi_{11}-\pi_{12})T_1(\alpha)-\frac{N^3}{2}\pi_{44}T_2(\alpha) \qquad \text{EQUATION 10}$$

Since $u_1$, $v_1$, $u_2$, $v_2$ are determined by a stress condition and a light position direction in Equation 9, $T_1(\alpha)$ and $T_2(\alpha)$ are determined by the stress condition, light position direction and $\alpha$, and do not depend upon a wavelength of light.

Therefore, the following equation is established where $N_1$, $N_2$ and $N_3$ are refractive indexes of three kinds of light having different wavelengths, $[(\pi_{ij})_1]$ $[(\pi_{ij})_2]$ and $[(\pi_{ij})_3]$ are piezo-optical tensors of these kinds of light, $\Delta N_1(\alpha)$, $\Delta N_2(\alpha)$ and $\Delta N_3(\alpha)$ correspond to $\Delta N(\alpha)$ for each light for the same stress condition, light position direction, and $\alpha$.

$$\Delta N_i(\alpha)=-\frac{N_i^3}{2}p_iT_1(\alpha)-\frac{N_i^3}{2}q_iT_2(\alpha) \qquad \text{EQUATION 11}$$

$$i=1,2,3$$

$$p_i=(\pi_{11})_i-(\pi_{12})_i$$

$$q_1=(\pi_{44})_i$$

Equation 12 is obtained from Equation 11.

$$r_1=p_2q_3-p_3q_2 \quad r_2=p_3q_1-p_1q_3 \quad r_3=p_1q_2-p_2q_1 \qquad \text{EQUATION 12}$$

$$K_1=-\left(\frac{N_3}{N_1}\right)^3\frac{r_1}{r_3} \quad K_2=-\left(\frac{N_3}{N_2}\right)^3\frac{r_2}{r_3}$$

$$\Delta N_3(\alpha)=K_1\Delta N_1(\alpha)+K_2\Delta N_2(\alpha)$$

The following equation is obtained by substituting Equation 8 for Equation 12 where Equation 8 is established for each light where $\Delta N_i$ and $\Phi_i$ are respectively a birefringence amount and a birefringence azimuth for the three kinds of light:

$$\Delta N_3\cos(2\alpha-2\phi_3)=K_1\Delta N_1\cos(2\alpha-2\phi_1)+K_2\Delta N_2\cos(2\alpha-2\phi_2) \qquad \text{EQUATION 13}$$

$$A_1=K_1\Delta N_1 \quad A_2=K_2\Delta N_2$$

$$\begin{aligned}\Delta N_3\cos(2\alpha-2\phi_3)&=A_1\cos(2\alpha-2\phi_1)+A_2\cos(2\alpha-2\phi_2)\\&=A_1(\cos2\alpha\cos2\phi_1+\sin2\alpha\sin2\phi_1)+A_2(\cos2\alpha\cos2\phi_2+\sin2\alpha\sin2\phi_2)\\&=(A_1\cos2\phi_1+A_2\cos2\phi_2)\cos2\alpha+(A_1\sin2\phi_1+A_2\sin2\phi_2)\sin2\alpha\\&=\sqrt{A_1^2+A_2^2+2A_1A_2\cos(2\phi_1-2\phi_2)}\cos(2\alpha-\beta)\end{aligned}$$

$$\beta=\tan^{-1}\left(\frac{A_1\sin2\phi_1+A_2\sin2\phi_2}{A_1\cos2\phi_1+A_2\cos2\phi_2}\right)$$

$0<2\Phi_3<\pi$ when the numerator is positive, whereas $-\pi<2\Phi_3<0$ when the numerator is negative.

The following equation is obtained from Equations 12 and 13:

$$p_i=(\pi_{11})_i-(\pi_{12})_i \quad q_i=(\pi_{44})_i \quad (i=1,2,3) \qquad \text{EQUATION 14}$$

$$r_1=p_2q_3-p_3q_2 \quad r_2=p_3q_1-q_1q_3 \quad r_3=p_1q_2-p_2q_1$$

$$K_1=-\left(\frac{N_3}{N_1}\right)^3\frac{r_1}{r_3} \quad K_2=-\left(\frac{N_3}{N_2}\right)^3\frac{r_2}{r_3}$$

$$A_1=K_1\Delta N_1 \quad A_2=K_2\Delta N_2$$

$$\Delta N_3=\sqrt{A_1^2+A_2^2+2A_1A_2\cos(2\phi_1-2\phi_2)}$$

$$2\phi_3=\tan^{-1}\left(\frac{A_1\sin2\phi_1+A_2\sin2\phi_2}{A_1\cos2\phi_1+A_2\cos2\phi_2}\right)$$

$0<2\Phi_3<\pi$ when the numerator is positive, whereas $-\pi<2\Phi_3<0$ when the numerator is negative.

In accordance with the aforementioned principal, the birefringence azimuth $\Phi_3$ and birefringence amount $\Delta N_3$ to the third light are calculated using Equation 14 where $N_1$, $N_2$ and $N_3$, and $[(\pi_{ij})_1]$ $[(\pi_{ij})_2]$ and $[(\pi_{ij})_3]$ are refractive indexes and piezo-optical tensors respectively to the first, second and third light, $\Phi_1$ and $\Phi_2$, and $\Delta N_1$ and $\Delta N_2$ are birefringence azimuths and birefringence amounts of the light of the first and second light source.

When the refractive indexes $N_1$, $N_2$ and $N_3$ and piezo-optical tensors $[(\pi_{ij})_1]$ $[(\pi_{ij})_2]$ and $[(\pi_{ij})_3]$ are unknown, $K_1$ and $K_2$ may be calculated back by previously measuring birefringence amount $\Delta N_1$, $\Delta N_2$, and $\Delta N_3$ and azimuths $\Phi_1$, $\Phi_2$, and $\Phi_3$ of an object (e.g., as a sample) to the first, secondhand third light. When $K_1$ and $K_2$ are calculated, then the birefringence amounts $\Delta N_1$ and $\Delta N_2$ and birefringence azimuths $\Phi_1$ and $\Phi_2$ of a new object to the first and second light are measured and $K_1$, $K_2$, $\Delta N_1$, $\Delta N_2$, $\Phi_1$, and $\Phi_2$ are substituted for the latter half in Equation 14 so as to calculate the birefringence azimuth $\Phi_3$ and birefringence amount $\Delta N_3$ of the object to the third light.

FIG. 1 is a block diagram of a birefringence measurement apparatus of one embodiment according to the present invention. In FIG. 1, 1 is a first light source, 2 is a second light source, 3 is an optical-path switching mirror, 4 is a birefringence measurement means, and 5 is a determination means.

In FIG. 1, calcium fluoride is located in the birefringence measurement means 4. The measurement of birefringence by the birefringence measurement means 4 may use any known method, such as a birefringence measuring method disclosed in Japanese Laid-Open Patent Application No. 8-254495.

The birefringence measurement means 4 initially measures a birefringence azimuth $\Phi_1$ and a birefringence amount $\Delta N_1$ using the first light source 1, and then measures a birefringence azimuth $\Phi_2$ and a birefringence amount $\Delta N_2$ using the second light source 2. Here, the light from the first light source 1 is designed to pass the same spot as that for the light from the second light source 2. The information obtained from the birefringence measurement means 4 ($\Delta N_1$, $\Phi_1$) and ($\Delta N_2$, $\Phi_2$) is sent to the determination means 5. The determination means 5 has previously stored information regarding the refractive index and piezo-optical tensor of calcium fluoride to the first light ($N_1$, $[(\pi_{ij})_1]$), information regarding the refractive index and piezo-optical tensor of calcium fluoride to the second light ($N_2$, $[(\pi_{ij})_2]$), and information regarding the refractive index and piezo-optical tensor of calcium fluoride to the first light ($N_3$, $[(\pi_{ij})_3]$). The determination means 5 calculates and determines the birefringence azimuth $\Phi_3$ and birefringence amount $\Delta N_3$ to the third light using Equation 14 and these pieces of information ($\Delta N_1$, $\Phi_1$), ($\Delta N_2$, $\Phi_2$), ($N_1$, $[(\pi_{ij})_1]$), ($N_2$, $[(\pi_{ij})_2]$) and ($N_3$, $[(\pi_{ij})_3]$).

While the determination means 5 in the above embodiments has used calculations to determine a birefringence azimuth and a birefringence amount to the third light, the present invention is not limited to these embodiments. For example, the determination means 5 has previously stored, as a reference table, a relationship among birefringence azimuths and birefringence amounts to the first and second light and a birefringence azimuth and a birefringence amount to the third light, and the determination means 5 may determine, without calculation, a birefringence azimuth and a birefringence amount to the third light using the reference table and the measured birefringence azimuths and birefringence amounts to the first and second light.

Since an environment purged with a little oxygen is feasible for the light with a wavelength equal to or larger than 180 nm, the instant embodiment sets the wavelengths of the light from the first and second light sources 1 and 2 to be equal to or larger than 180 nm (for example, the wavelength of light from the first light source being set to be about 193 nm, and the wavelength of light from the second light source being set to be about 248 nm) so that the birefringence azimuth and birefringence amount to $F_2$ laser (with a wavelength of 157 nm) may be measured under the environment purged with a little oxygen.

Since air is feasible for the light with a wavelength equal to or larger than 200 nm, the birefringence azimuth and birefringence amount to $F_2$ laser (with a wavelength of 157 nm) may be measured in air when the wavelengths of the light from the first and second light sources 1 and 2 to be equal to or larger than 200 nm.

While the above embodiment calculates the birefringence azimuth and birefringence amount to $F_2$ laser (with a wavelength of 157 nm) as the third light, the present invention may, of course, calculate the birefringence azimuth and birefringence amount to the light other than $F_2$ laser.

As a result of that the birefringence amount of calcium fluoride as a material for optical elements is measured using the inventive birefringence measurement apparatus, calcium fluoride is processed and an optical element, such as a projection lens for use with an exposure apparatus, is manufactured when the birefringence amount of calcium fluoride is less than a predetermined value.

Alternatively, an exposure apparatus may use an optical element only if the birefringence amount of the optical element is measured using the inventive birefringence measurement apparatus and found to be less than the predetermined value.

Figure 2:
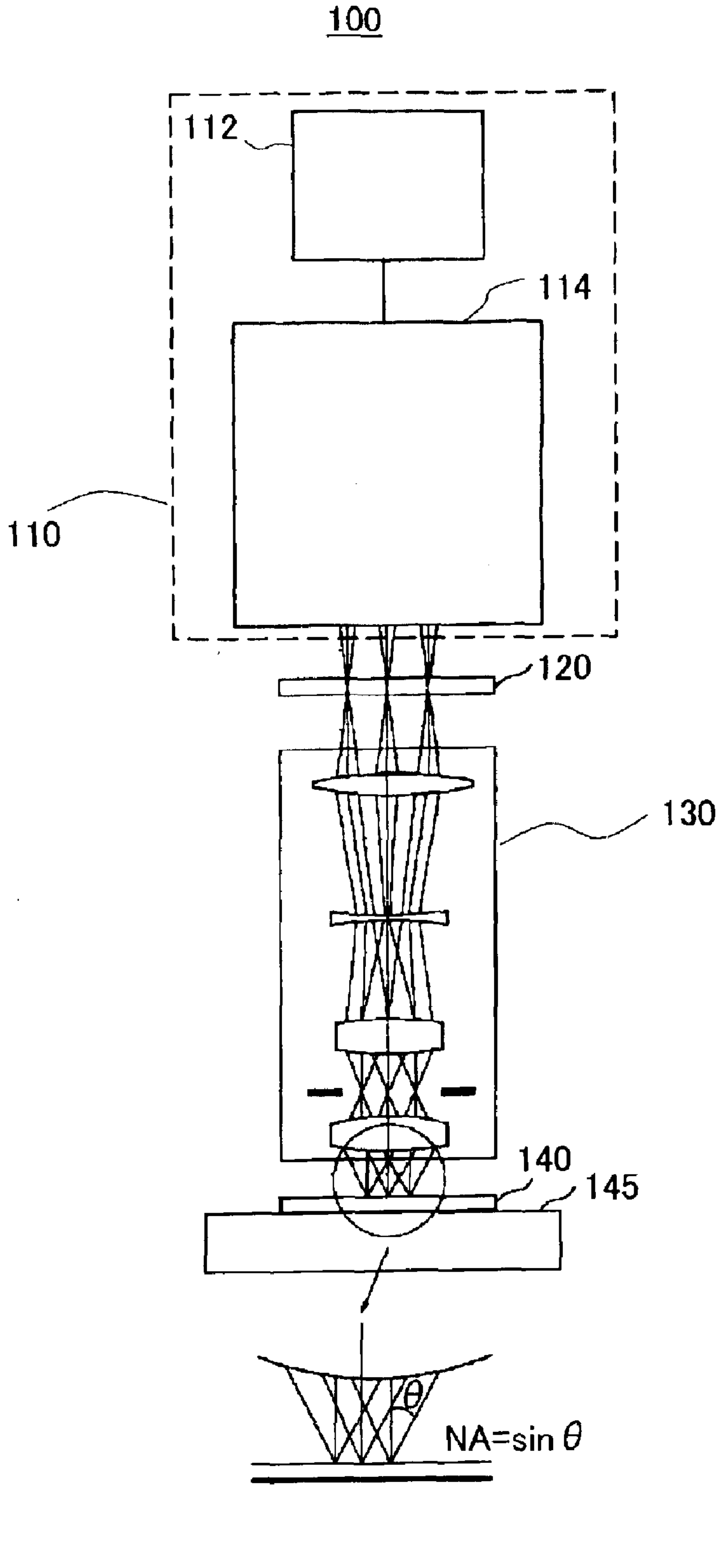
FIG. 2 is a schematic sectional view of the exposure apparatus of one embodiment according to the present invention.

Referring now to FIG. 2, a description will be given of an exemplified exposure apparatus 100 of the present invention. FIG. 2 is a schematic sectional view of the exposure apparatus 100. The exposure apparatus 100 includes, as shown in FIG. 2, an illumination apparatus 110, a reticle 120, a projection optical system 130, a plate 140, and a stage 145. The exposure apparatus 100 may be a step-and-repeat or step-and-scan projection exposure apparatus.

The illumination apparatus 110 includes a light source part 112 and an illumination optical system 114, and illuminates the reticle 120 on which a circuit pattern to be transferred is formed.

The light source part 112 may use, for example, a laser as a light source. An $F_2$ excimer laser with the wavelength of approximately 157 nm is used for but not limited to the light source. The illumination optical system 114 is an optical system for illuminating a mask or reticle 120, and includes a lens, a mirror, a light integrator, an aperture, and the like. For example, a condensing lens, a fly-eye lens, an aperture stop, a condensing lens, a slit, and an image-forming optical system may be arranged in this order. The illumination optical system 114 may use on-axis or off-axis light, and include the above inventive optical element.

The reticle 120, on which a circuit pattern (or image) to be transferred is formed, is held on a reticle stage (not shown) and driven. The reticle stage (not shown) may be two-dimensionally driven on a reticle surface by a drive system (also not shown). The coordinates of the reticle stage may be measured and adjusted by an interferometer using a reticle movement mirror (not shown), and the positioning of the reticle may be controlled. Diffraction light emitted from the reticle 120 passes through the projection optical system 130, and projected on the plate 140. The plate 140 is an object to be processed such as a wafer and a liquid crystal substrate, and resist is applied to the plate 140. The reticle 120 and the plate 140 are arranged conjugate with each other. In a scanner, the mask 120 and the plate 140 are synchronously scanned and a pattern is transferred on the plate 140. In a stepper, the mask 120 and the plate 140 stand still during exposure.

The projection optical system 130 has a magnification of ⅕ through ½, and projects a reduced image of a circuit pattern of the reticle 120 on the plate 140. The projection optical system 130 is a refraction system including the above optical element, and a substantially telecentric area at the both sides of the reticle 120 and the plate 140. Of course, the projection optical system 130 may use an optical system including a plurality of lens elements and at least one concave mirror (catadioptric optical system), an optical system including a plurality of lens elements and at least one diffraction optical element such as a kinoform. When correction for color aberration is required, a plurality of lens elements may be made of glass materials, which vary with each other in the degree of dispersion (Abbe number), or a diffraction optical element may be so constructed as to produce dispersion in a direction opposite to a lens element.

The plate 140 is a wafer in this embodiment, but may include a liquid crystal plate and a wide range of other objects to be exposed. Photoresist is applied onto the plate 400. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 140 is supported by the stage 145. The stage 145 may use any structure known in the art, and thus a detailed description of its structure and operations is omitted. For example, the stage 145 uses a linear motor to move the plate 140 in X-Y directions. The mask 120 and plate 140 are, for example, scanned synchronously, and the positions of the mask stage and wafer stage 450 (not shown) are monitored, for example,. by a laser interferometer, so that both are driven at a constant speed ratio.

In exposure, light beams emitted from the light source part 112 Kohler-illuminate the reticle 120 via the illumination optical system 114. Light that has passed through the reticle 120 involves a mask pattern and is projected and images on the plate 140 via the projection optical system 130. The illumination and/or projection optical systems 114 and 130 with the inventive optical element allow ultraviolet, deep ultraviolet, and vacuum ultraviolet light to pass with high transmittance and less refractive index uniformity or birefringence, and thus may provide devices (semiconductor elements, LCD elements, image pickup elements such as CCDs, thin-film magnetic heads, or the like) with high resolution and throughput.

Thus, the small and inexpensive inventive birefringence measurement apparatus measures the birefringence of a material for an optical element or the optical element itself, and may supply an optical element inexpensively.

As discussed, the present invention may provide a small and inexpensive measurement apparatus with a superior operability since the measurement apparatus may measure the birefringence azimuth and birefringence amount to, for example, $F_2$ laser (with a wavelength of 157 nm) under an environment purged with a little oxygen or even air.

What is claimed is:

1. A birefringence measurement apparatus comprising:

a measurement part for measuring a birefringence azimuth and a birefringence amount of an object to first light, and measuring a birefringence azimuth and a birefringence amount of the object to second light having a different wavelength from the first light; and a determination part for determining at least one of a birefringence azimuth and a birefringence amount to third light different in wavelength from the first and second light based on the birefringence azimuth and birefringence amount of the object to the first and second light.

2. A birefringence measurement apparatus according to claim 1, wherein said determination part determines, through calculation, said at least one of a birefringence azimuth and a birefringence amount to the third light.

3. A birefringence measurement apparatus according to claim 1, wherein the first and second light have wavelengths equal to or larger than 180 nm, and the third light has a wavelength less than the wavelengths of the first and second light.

4. A birefringence measurement apparatus according to claim 3, wherein the first and second light have wavelength equal to or larger than 200 nm.

5. A birefringence measurement apparatus according to claim 1, wherein the object is made of calcium fluoride.

6. A birefringence measurement apparatus according to claim 1, wherein the third light is a light of the same wavelength as an $F_2$ laser.

7. A birefringence measurement apparatus according to claim 1, wherein said determination part calculates a birefringence azimuth $\Phi_3$ and birefringence amount $\Delta N_3$ to the third light using the following equations where $N_1$, $N_2$ and $N_3$, and $[(\pi_{ij})_1]$ $[(\pi_{ij})_2]$ and $[(\pi_{ij})_3]$ are refractive indexes and piezo-optical tensors respectively of the object to the first, second and third light, $\Phi_1$ and $\Phi_2$, and $\Delta N_1$ and $\Delta N_2$ are birefringence azimuths and birefringence amounts of the object to the first and second light measured by said measurement part:

$$p_i = (\pi_{11})_i - (\pi_{12})_i \qquad q_i = (\pi_{44})_i \qquad (i = 1, 2, 3)$$

$$r_1 = p_2q_3 - p_3q_2 \quad r_2 = p_3q_1 - q_1q_3 \quad r_3 = p_1q_2 - p_2q_1$$

$$K_1 = -\left(\frac{N_3}{N_1}\right)^3 \frac{r_1}{r_3} \qquad K_2 = -\left(\frac{N_3}{N_2}\right)^3 \frac{r_2}{r_3}$$

$$A_1 = K_1 \Delta N_1 \qquad A_2 = K_2 \Delta N_2$$

$$\Delta N_3 = \sqrt{A_1^2 + A_2^2 + 2A_1A_2\cos(2\phi_1 - 2\phi_2)}$$

$$2\phi_3 = \tan^{-1}\left(\frac{A_1\sin 2\phi_1 + A_2\sin 2\phi_2}{A_1\cos 2\phi_1 + A_2\cos 2\phi_2}\right)$$

$0<2\Phi_3<\pi$ when the numerator is positive, whereas $-\pi<2\Phi_3<0$ when the numerator is negative.

8. A birefringence measurement method comprising the steps of:

measuring a birefringence azimuth and a birefringence amount of an object to first light;

measuring a birefringence azimuth and a birefringence amount of an object to second light having a different wavelength from the first light; and determining at least one of a birefringence azimuth and a birefringence amount of the object to third light different in wavelength from the first and second light based on the birefringence azimuth and birefringence amount of the object to the first and second light.

9. A method for manufacturing an optical element comprising the step of measuring a birefringence amount using a birefringence measurement apparatus that includes a measurement part for measuring a birefringence azimuth and a birefringence amount of an object to first light, and a measurement part for measuring a birefringence azimuth and a birefringence amount of the object to second light having a different wavelength from the first light, and a determination part for determining at least one of a birefringence azimuth and a birefringence amount to third light different in wavelength from the first and second light based on the birefringence azimuth and birefringence amount of the object to the first and second light.

10. A projection exposure apparatus comprising a projection optical system that includes an optical element manufactured by a method using a birefringence measurement apparatus that includes a measurement part for measuring a birefringence azimuth and a birefringence amount of an object to first light and measuring a birefringence azimuth and a birefringence amount of the object to second light having different wavelengths from the first light, and a determination part for determining at least one of a birefringence azimuth and a birefringence amount to third light different in wavelength from the first and second light based on the birefringence azimuth and birefringence amount of the object to the first and second light.

* * * * *